(12) United States Patent
Hindle et al.

(10) Patent No.: US 10,197,637 B2
(45) Date of Patent: Feb. 5, 2019

(54) METHOD AND SYSTEM FOR PERFORMING DIAGNOSTICS AND MONITORING A DC SUBSYSTEM

(71) Applicant: Hindle Power, Inc., Easton, PA (US)

(72) Inventors: William A. Hindle, Everittstown, NJ (US); Nicholas C. Hindle, Clinton, NJ (US); Robert Beck, Allentown, PA (US); Larry S. Meisner, East Norriton, PA (US)

(73) Assignee: Hindle Power, Inc., Easton, PA (US)

( * ) Notice: Subject to any disclaimer, the term of this patent is extended or adjusted under 35 U.S.C. 154(b) by 0 days.

(21) Appl. No.: 16/057,895

(22) Filed: Aug. 8, 2018

(65) Prior Publication Data
US 2018/0356470 A1    Dec. 13, 2018

Related U.S. Application Data

(63) Continuation of application No. 15/572,668, filed as application No. PCT/US2016/031818 on May 11, 2016, now Pat. No. 10,073,149.

(60) Provisional application No. 62/159,677, filed on May 11, 2015.

(51) Int. Cl.
| | | |
|---|---|---|
| *G08B 21/00* | (2006.01) | |
| *G01R 31/40* | (2014.01) | |
| *G01R 1/02* | (2006.01) | |
| *G01R 31/36* | (2006.01) | |
| *H02J 7/02* | (2016.01) | |
| *H02J 7/00* | (2006.01) | |

(52) U.S. Cl.
CPC ............. *G01R 31/40* (2013.01); *G01R 1/025* (2013.01); *G01R 31/36* (2013.01); *H02J 7/0021* (2013.01); *H02J 7/0068* (2013.01); *H02J 7/02* (2013.01); *H02J 7/027* (2013.01); *H02J 7/0047* (2013.01)

(58) Field of Classification Search
CPC .................................. G06F 1/00; G06T 1/00
See application file for complete search history.

(56) References Cited

U.S. PATENT DOCUMENTS

| | | | | |
|---|---|---|---|---|
| 2010/0121587 A1* | 5/2010 | Vian | .................. | G01R 31/3651 702/63 |
| 2011/0084650 A1* | 4/2011 | Kaiser | ...................... | H02J 4/00 320/107 |

* cited by examiner

*Primary Examiner* — Shirley Lu
(74) *Attorney, Agent, or Firm* — Design IP

(57) ABSTRACT

The present application discloses a system and method for monitoring and reporting the status of a direct current (DC) subsystem including a battery bank and battery charger. The system and method are configured to perform tests on distinct modules within the DC subsystem and store test data. The test data are analyzed to determine the status of each module. An aggregator determines the DC subsystem status based on the module statuses and displays an indication of the determined aggregate status.

9 Claims, 20 Drawing Sheets

METHOD AND SYSTEM FOR PERFORMING DIAGNOSTICS AND MONITORING A DC SUBSYSTEM

BACKGROUND OF THE INVENTION

Direct current (DC) subsystems supply power to DC relay subsystems in electrical utility substations, and therefore, are a critical component in the operation of the substations. DC subsystems convert alternating current (AC) power to DC power for use in operating the DC relay subsystem and provide uninterrupted power to DC relay systems in the case of a loss in AC power or a brownout. Uninterrupted power is provided by batteries, which are maintained and monitored by other modules in the DC subsystem.

Regular diagnostic testing of DC subsystems is critical to reliable operation. In addition, new North American Electric Reliability Corporation (NERC) standards require more frequent inspection and testing of DC subsystems. In DC subsystems of the prior art, a technician must visit each physical substation location and typically perform tests by manually connecting test equipment to various components of the DC subsystem. Due to the potential for injury, such tests must be performed by a highly-trained technician at significant cost to the operator of the substation. Accordingly, there is a need for DC subsystems that enable diagnostic tests to be performed and reviewed by technicians with a wider variety of levels of skill and experience.

BRIEF DESCRIPTION OF THE DRAWINGS

Other aspects, features, and advantages of described embodiments will become more fully apparent from the following detailed description, the appended claims, and the accompanying drawings in which like reference numerals identify similar or identical elements.

DETAILED DESCRIPTION OF THE PREFERRED EMBODIMENTS

Figure 1:
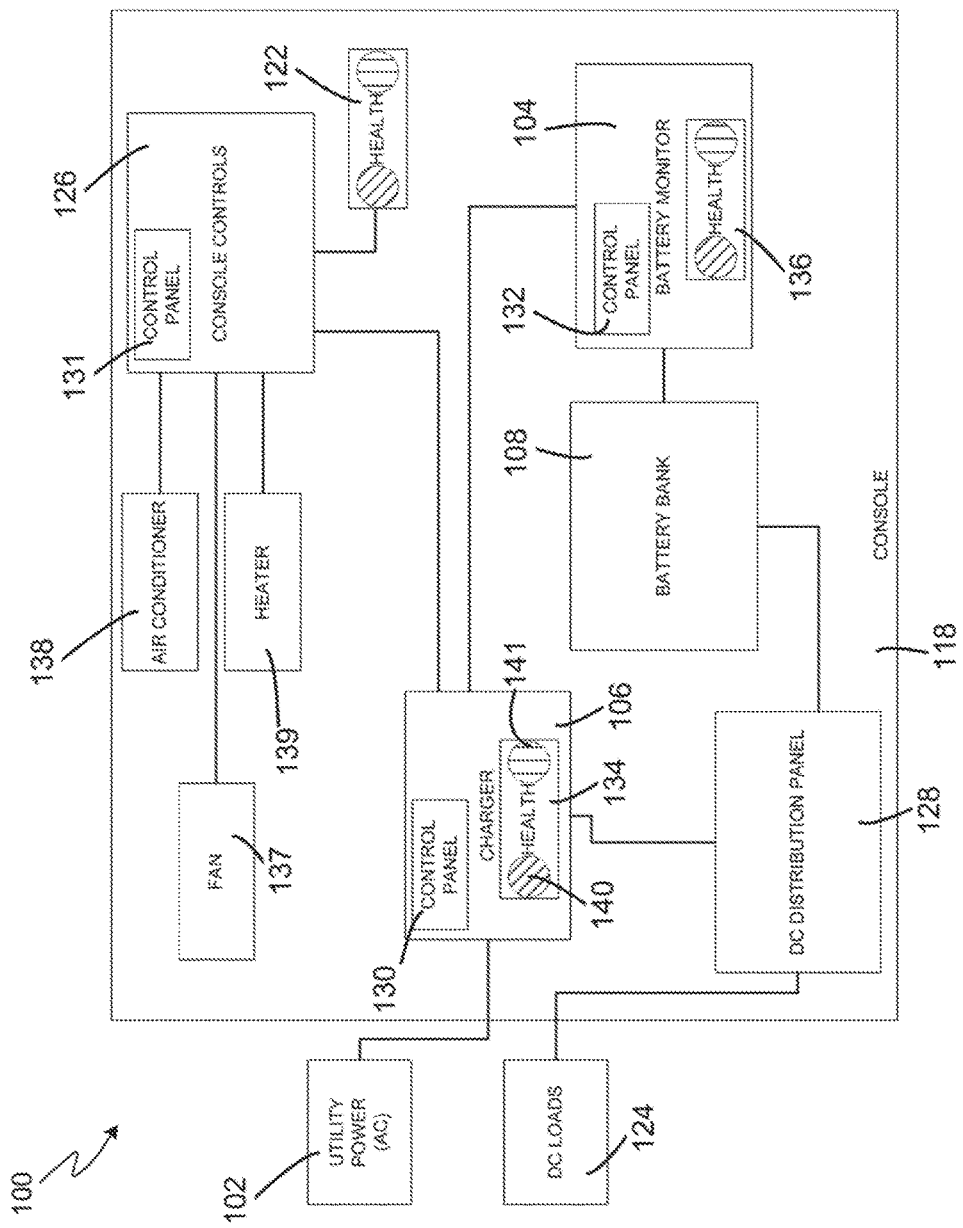
FIG. 1 shows a simplified block diagram of a DC subsystem in accordance with described embodiments.

The ensuing detailed description provides those skilled in the art with an enabling description for implementing the described embodiments. Various changes might be made in the function and arrangement of described elements without departing from the spirit and scope of the appended claims.

Directional terms may be used in this specification and claims to describe portions of the present invention (e.g., upper, lower, left, right, etc.). These directional terms are merely intended to assist in describing the embodiments, and are not intended to limit the scope of the claims. In addition, reference numerals that are introduced in the specification in association with a drawing figure may be repeated in one or more subsequent figures without additional description in the specification in order to provide context for other features.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

While the embodiments have been described with respect to processing blocks in a software program, including possible implementation as a digital signal processor, microcontroller, or general-purpose computer, described embodiments are not so limited. As would be apparent to one skilled in the art, various functions of software might also be implemented as processes of circuits. Such circuits might be employed in, for example, a single integrated circuit, a multi-chip module, a single card, or a multi-card circuit pack.

Described embodiments might also be embodied in the form of methods and apparatuses for practicing those methods. Described embodiments might also be embodied in the form of program code embodied in non-transitory tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing described embodiments. Described embodiments might can also be embodied in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the described embodiments. When implemented on a general-purpose processor, the program code segments combine with the processor to provide a unique device that operates analogously to specific logic circuits. Described embodiments might also be embodied in the form of a bitstream or other sequence of signal values electrically or optically transmitted through a medium, stored magnetic-field variations in a magnetic recording medium, etc., generated using a method and/or an apparatus of the described embodiments.

It should be understood that the steps of the methods set forth herein are not necessarily required to be performed in the order described, and the order of the steps of such methods should be understood to be presented as examples. Likewise, additional steps might be included in such methods, and certain steps might be omitted or combined, in methods consistent with various described embodiments.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

Referring to FIG. 1, an exemplary embodiment of a DC subsystem 100 of a utility substation is shown. The DC subsystem 100 includes a console 118 which houses a battery bank 108, a battery charger 106, console control module 126. The DC subsystem 100 also includes a battery monitor/tester 104. The console control module 126, battery charger 106, and the battery monitor 104 are referred to herein as modules of the DC subsystem 100. Other common modules/equipment in a DC subsystem include switch gear/relays, invertors, meters, transducers and communication equipment. Electrical connections between elements of the DC subsystem are schematically represented in FIG. 1 by lines connecting elements. In order to simplify FIG. 1, other electrical elements, such as switches and relays are omitted.

As described above, the function of the DC subsystem is to provide power to the DC work load 124. When utility power (represented by the power supply 102) is present, the power supply 102 provides AC power to the battery charger 106. The battery charger 106 supplies DC power to the DC distribution panel 128 and charges the battery bank 108 as needed to keep the batteries in the battery bank 108 fully charged. DC power is distributed to the DC work loads 124 by the DC distribution panel 128. In the case of a blackout or brownout (i.e., full or partial loss of power from the power supply 102), DC power to the DC distribution panel 128 is supplied by the battery bank 108.

The function of the battery monitor 104 is to monitor the status and performance of the batteries in the battery bank 108 and, optionally, the function and performance of the battery charger 106. A more detailed description of the capabilities of the battery charger is provided in co-pending PCT Application No. PCT/US16/31636, filed May 10, 2016, which is hereby incorporated by reference as if fully set forth.

The function of the console control module 126 is to monitor and control the temperature inside the console 118 and, optionally, to monitor other environmental conditions. For example, the console control module 126 could monitor battery temperature, hydrogen levels, and fan operational status (i.e., to detect faulty fans). The console control module 126 is preferably operationally configured to activate an air conditioner 138, fan 137, or an optional heater 139 as needed to maintain the temperature inside the console 118 or battery temperature within a preferred temperature range. The preferred temperature range is selected to avoid premature failure of batteries in the battery bank 108 due to extreme temperatures. The preferred temperature range will depend up on a number of factors, including the structure and composition of the batteries in the battery bank 108. The console control module 126 is also preferably operationally configured to activate hydrogen mitigation (typically an exhaust fan) if elevated levels of hydrogen are detected. The console control module 126 could also be operationally configured to activate one or more indicators or alarms if a measured environmental condition is outside of set parameters.

In order to assist with management of temperature, the console 118 is preferably insulated. In addition, the console 118 includes racks and mounts (not shown) which support the modules and the battery bank 108. The console 118 also preferably includes at least one door (not shown) that enables access to the modules and the battery bank 108.

In accordance with the present invention, the DC subsystem 100 also includes an integrated health monitoring system. The function of the health monitoring system is to verify the status (or "health") of each monitored module in the DC subsystem 100 through the running of a series of diagnostics/tests and to provide an easy-to-recognize visual indication of the status of each module. Optionally, a visual indication of the status of all of the monitored modules in the DC subsystem 100 can also be provided. As will be explained in greater detail herein, the information displayed and interaction required between a technician and the module during diagnostic tests is purposefully designed to build confidence on the part of the technician in the accuracy of the visual indication of status.

The integrated health monitoring system comprises module status indicators 134, 136 located on the outer surface of at least some of the modules and, in this embodiment, an aggregator status indicator 122 located the outer surface of the console 118. Each status indicator includes a plurality of lights that, in the case of the module status indicators 134, 136, provide a visual indication of the status of the module on which it is located and, in the case of the aggregator status indicator 122, provide a visual indication of the status of all of the modules in the DC subsystem 100. Alternatively, other types of indications could be used instead of, or in addition, to visual indications. For example, an audible alarm could be provided.

The visual indication for the module status indicator 134 for the battery charger 106 consists of a green light 140 that indicates that the battery charger 106 is operating within established parameters and a red light 141 that indicates battery charger 106 is not operating within established parameters. Optionally, the red light 141 could be illuminated in a constant manner when a warning or non-critical problem has been detected and could flash when a critical problem (i.e., as issue requiring immediate attention) has been detected. Alternatively, a third light (such as a yellow light, not shown) could be provided. In this case, the third light would be illuminated when a warning or non-critical problem has been detected and the red light illuminated only when a critical problem has been detected. It is preferable that each of the module status indicators 134, 136 and the aggregator status indicator 122 be substantially identical to each other in order to provide a consistent visual status indication for the technician.

As part of the health monitoring system, each module may include a control panel 130, 131, 132 having user inputs and a display. In addition, each module preferably includes a controller (such as a programmable logic controller or microcontroller) and a non-transitory storage medium programmed to execute diagnostic tests to determine the health of that module. In the exemplary embodiments described herein, the controller is a programmable logic controller (PLC). It should be understood that other types of controllers could be used.

Figure 2:
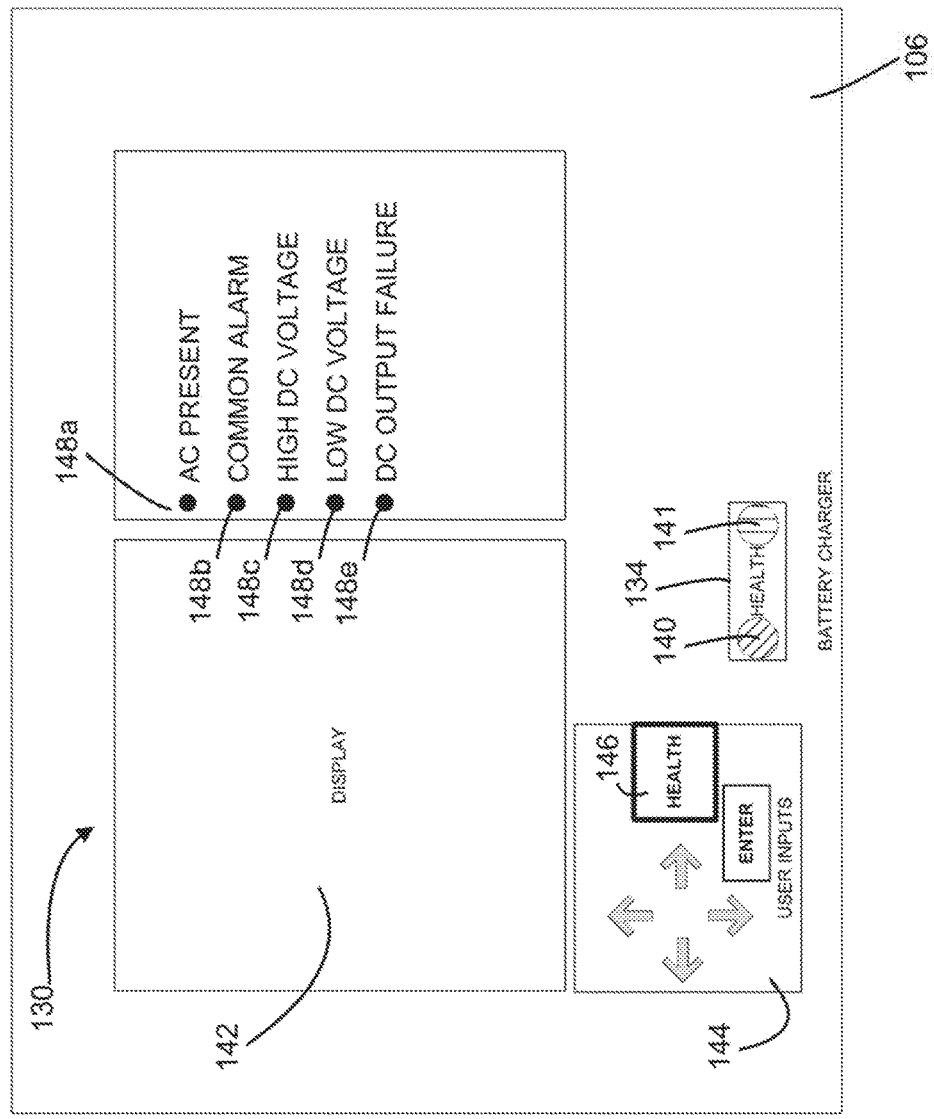
FIG. 2 shows greater detail of a battery charger of the DC subsystem of FIG. 1.

Referring to FIG. 2, the control panel 130 of the battery charger 106 includes a display 142, user inputs 144 and a series of indicator lights 148*a-e*. In this embodiment, the display 142 is a non-touch screen liquid crystal display and the user inputs 144 consist of a set of buttons, including a health button 146. Suitable buttons are provided as user inputs 144 to enable the user to navigate the display and respond to queries. Alternatively, the display 142 could be a touch-screen, in which case some or all of the buttons could be eliminated. The health button 146 is preferably provided even in embodiments where a touch screen display is provided. In other embodiments, the indicator lights 148*a-e* could be in a different order and/or different or additional indicator lights could be provided.

When the health button 146 is pressed, the controller activates a series diagnostic tests to determine the status of the battery charger 106 and, optionally, other components of the DC subsystem 100. Table 1 is an exemplary list of the diagnostic tests that this embodiment of a battery charger 106 is operationally configured to perform.

TABLE 1

| Test | Description | Real or Simulated |
|---|---|---|
| Lamp Test | Verify display LED function | Real |
| Meter Calibration | Verify charger voltage reading is accurate | Real |
| High Voltage DC | Verify the alarm, common relay, and any associated auxiliary relays function as intended when voltage raises above a high DC voltage set point | Simulated |
| Low Voltage DC | Verify the alarm, common relay, and any associated auxiliary relays function as intended when voltage lowers below a low DC voltage set point | Simulated |
| Ground Detect (Positive) | Verify the alarm, common relay, and any associated auxiliary relays function as intended when current detected in the positive ground leg | Simulated |
| Ground Detect (Negative) | Verify the alarm, common relay, and any associated auxiliary relays function as intended when current detected on the negative ground leg | Simulated |
| Ground Detect (combined) | Verify the alarm, common relay, and any associated auxiliary relays function as intended when current detected on either negative or positive leg | Simulated |
| Ripple Alarm | Verify the alarm, common relay, and any associated auxiliary relays function as intended when ripple voltage exceeds a set point threshold | Simulated |
| Auxiliary Board Relays (1-6) | Verify the contacts function (will check each relay by verifying the armature works by checking internal relay output) | Simulated |
| Remote Shutdown | Verify the alarm, common relay, and any associated auxiliary relays function as intended when remote shutdown threshold reached | Simulated |
| End of Discharge | Verify the alarm, common relay, and any associated auxiliary relays function as intended when battery voltage drops below a low battery voltage set point | Simulated |
| DC Output Failure | Verify the alarm, common relay, and any associated auxiliary relays function as intended when no output current detected | Simulated |
| Current Limit | Verify the alarm, common relay, and any associated auxiliary relays function as intended when output reaches threshold limit | Simulated |
| High Voltage AC | Verify the alarm, common relay, and any associated auxiliary relays function as intended when input AC rises above a predetermined threshold | Simulated |
| Low Voltage AC | Verify the alarm, common relay, and any associated auxiliary relays function as intended when input AC sags below a predetermined threshold | Simulated |
| Charger Temp at SCR | Reads SCR temperature and reports if in valid range | Real |
| Temp Compensation | Ensures battery temperature is within valid range, reports temperature to user for external verification | Real |
| Remote Sense | Compares external and internal voltage readings are within range of each other | Real |
| Fan Control | Toggles fan on, promptly user to confirm that fan is on or reads failure of signal out of fan | Real |
| Load Share | Verify communication link between multiple chargers is operating as intended | Real |

TABLE 1-continued

| Test | Description | Real or Simulated |
|---|---|---|
| SCR Operation | Ensures SCR is functioning as intended | Real |
| Battery Continuity | Lowers float voltage of charger and verifies that the battery bank picks up the system load | Real |
| Battery Discharge | Requires optional shunt. If shunt present, detects current flowing in 'opposite' direction from current flow to power the system load | Real |

The diagnostic tests performed by the battery charger 106 preferably fall into three categories:

autonomous diagnostic tests—tests that are performed without any user input;

semiautonomous diagnostic tests—tests that could be performed without any user input but are configured to require user input for the purpose of building trust on the part of the technician in the integrity of the test results (and visual indication thereof); and manual diagnostic tests—tests that require input or a measurement on the part of the user in order to determine/verify status.

An example of a semiautonomous diagnostic test is a battery discharge test.

Based on current technology, the health system would be capable of conducting a battery discharge test in a completely autonomous manner. However, in order to build trust with the user, the health monitoring system is preferably programmed to show each step of the testing process, the results of the test, the applicable parameters, and request that the user confirm whether the test results are within the applicable parameters. Optionally, the health system can be programmed to give the user the option to run diagnostic tests in a mode in which semiautonomous diagnostic tests are performed autonomously (i.e., without user input).

The lamp test (confirming that all of the indicator lights 148*a-e* are functioning) is example of diagnostic test that could arguably be categorized as semiautonomous or manual. As part of this test, the user is asked to confirm, using one of the user inputs 144, that each of the indicator lights 148*a-e* illuminates during the test. It would be possible for the battery charger 106 to determine that each indicator light 148*a-e* is functioning properly by activating the circuit that powers each light 148*a-e* and verifying that the voltage and current in that circuit is within acceptable parameters. However, some types of indicator lights 148*a-e* have failure modes that could fail without causing the operating characteristics of the circuit that powers each light to fall outside of acceptable operating parameters. Accordingly, having a user verify function of each of the indicator light 148*a-e* is arguably more reliable than an autonomous diagnostic test.

Figure 3A:
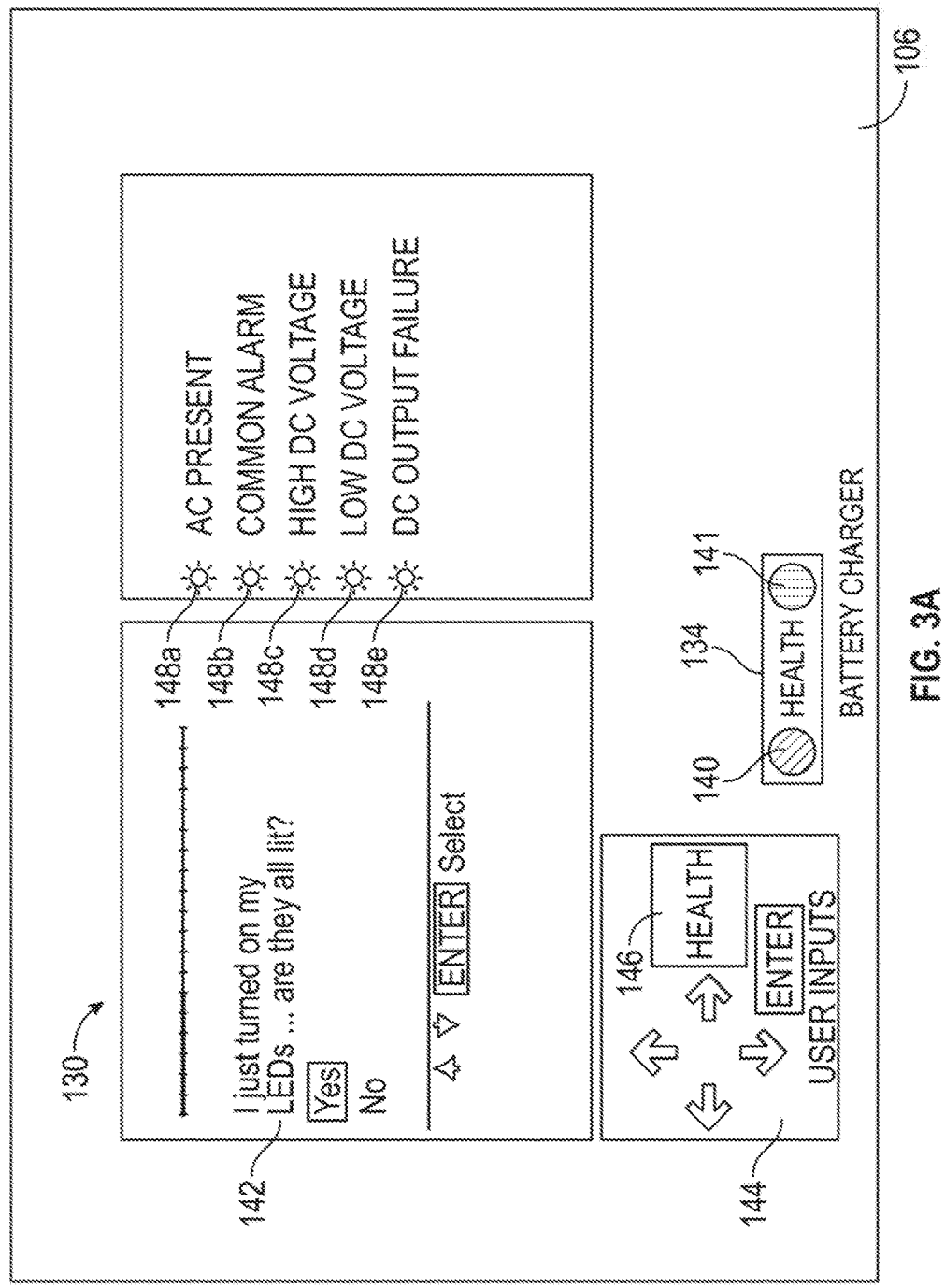
FIGS. 3A and 3B show exemplary screen messages associated with a lamp test.
Figure 3B:
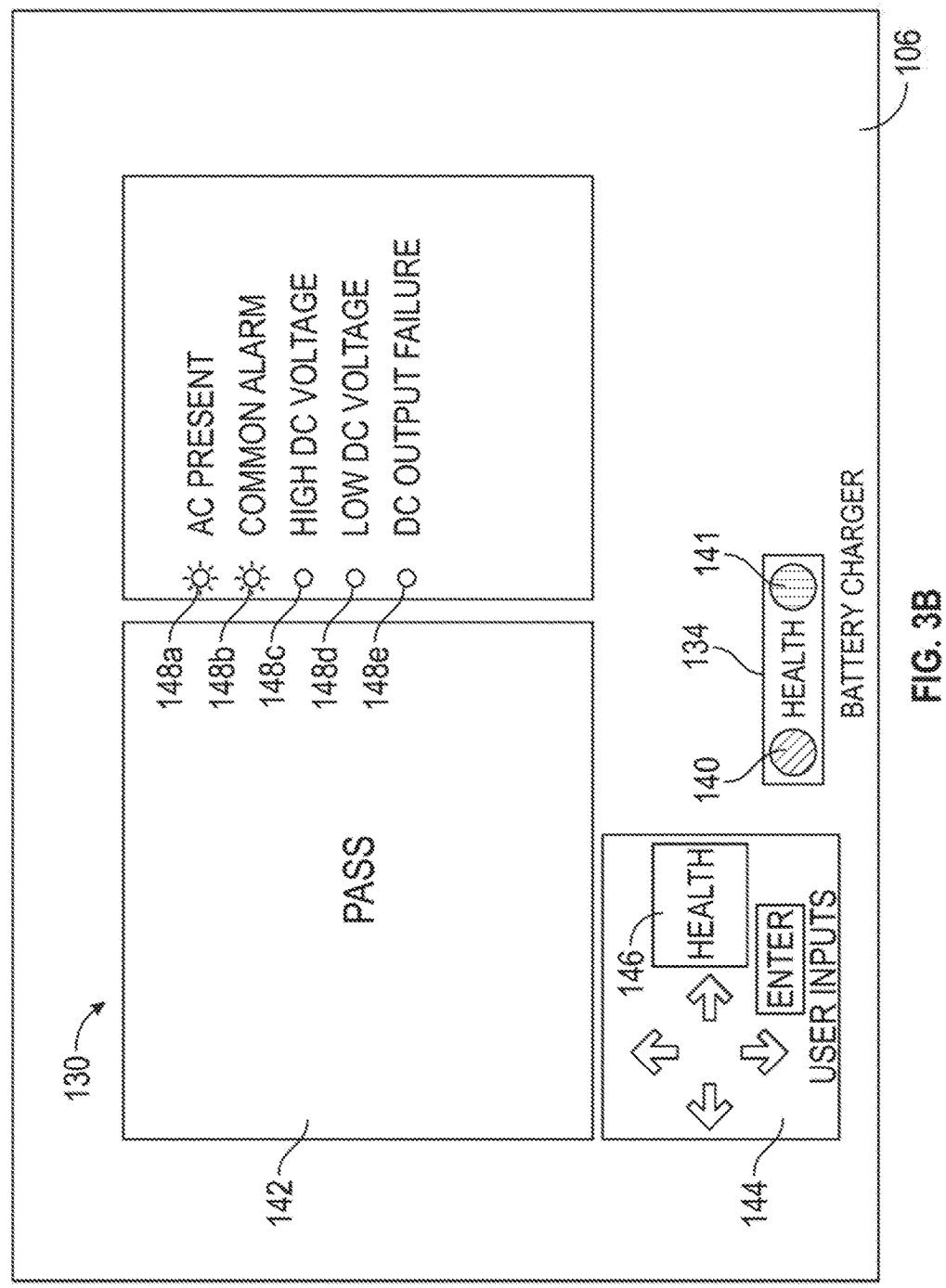

FIGS. 3A and 3B show exemplary sequential screen messages that could be provided on the display 143 during the performance of the lamp test. In the event that the user indicated "no" in response to FIG. 3A, the controller could route the user through additional tests (not shown) to determine which LED was not lit and, optionally, provide repair instructions.

Figure 4A:
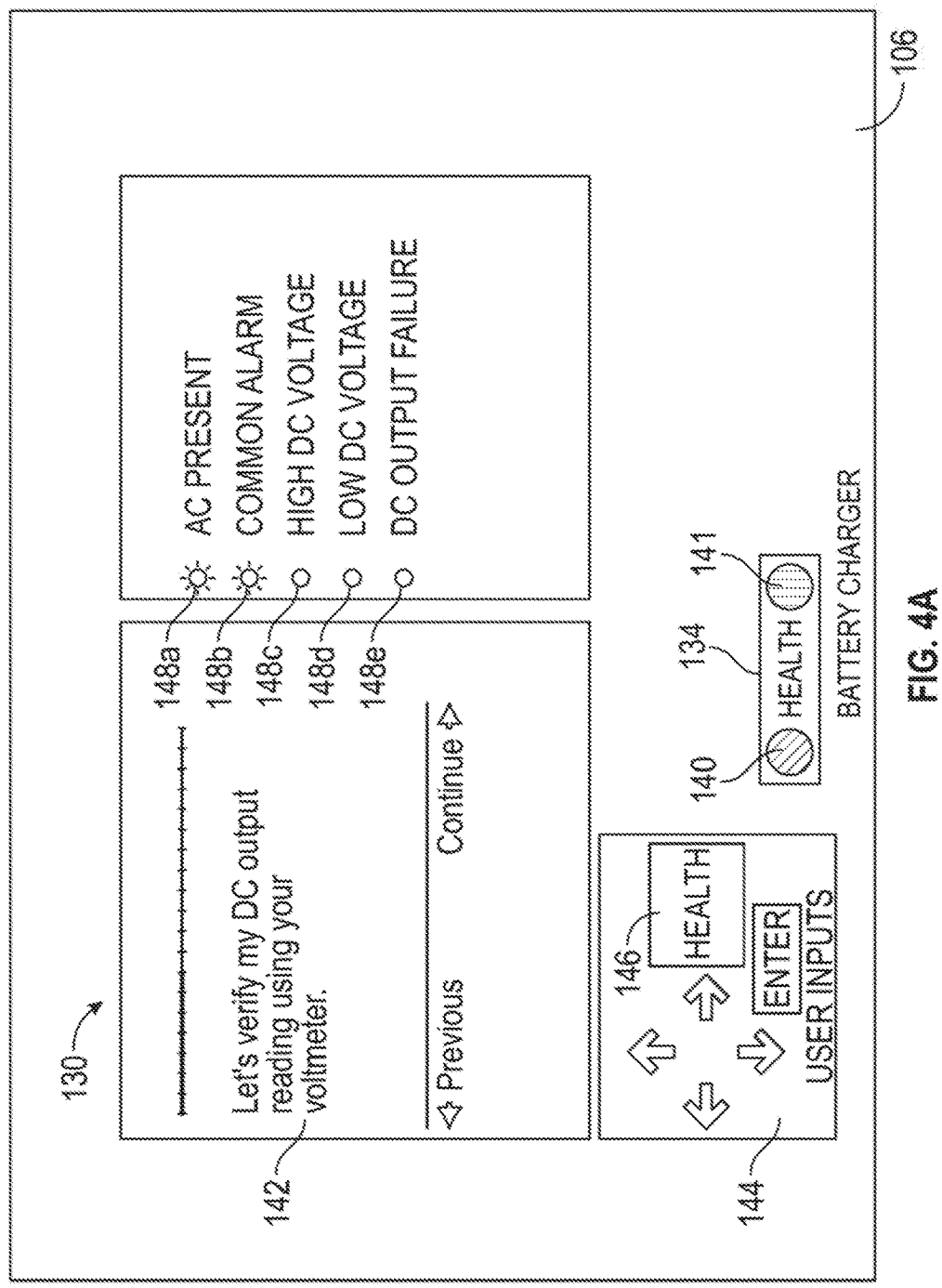
FIGS. 4A through 4C show exemplary screen messages associated with a meter calibration test.
Figure 4B:
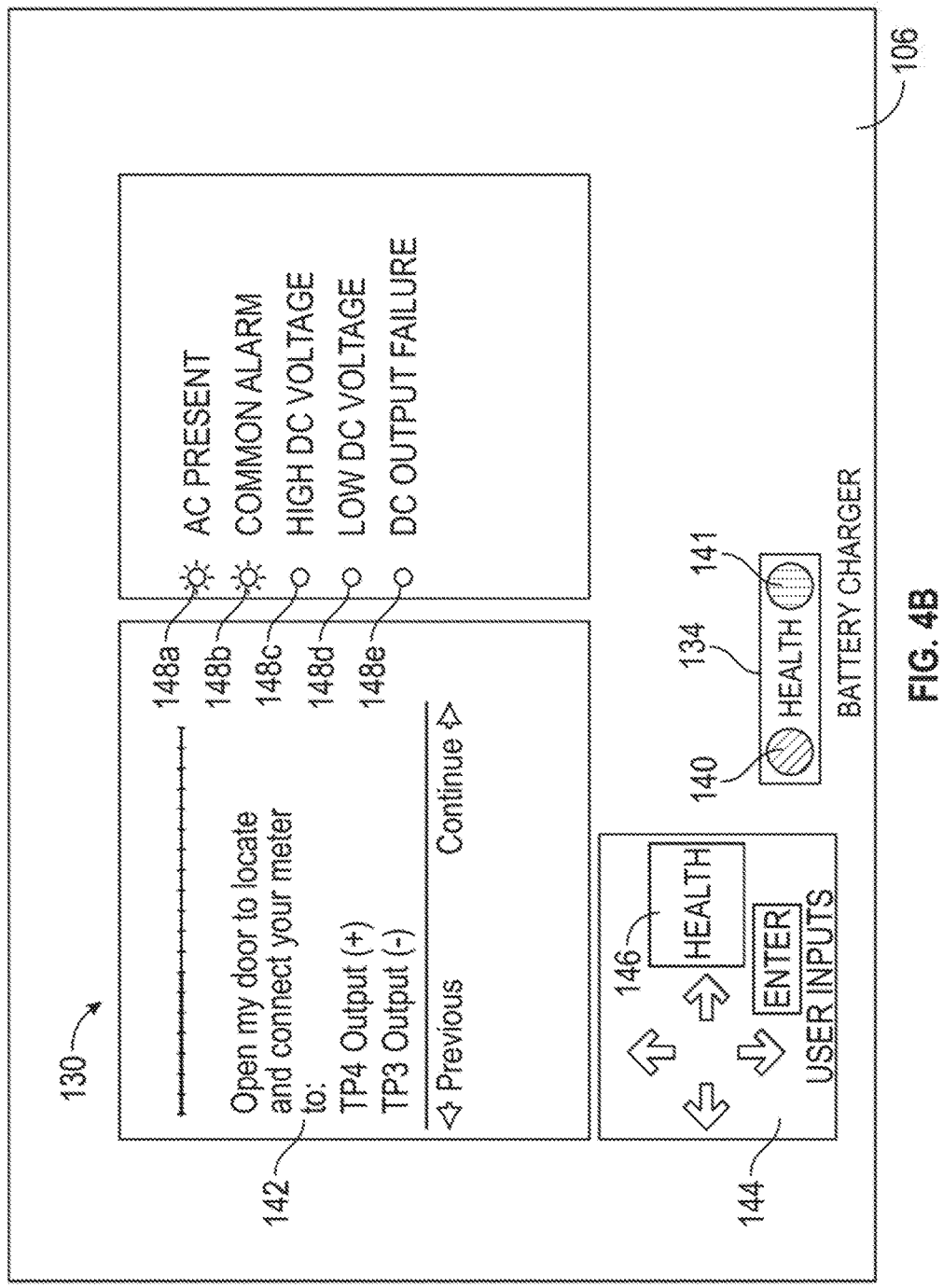
Figure 4C:
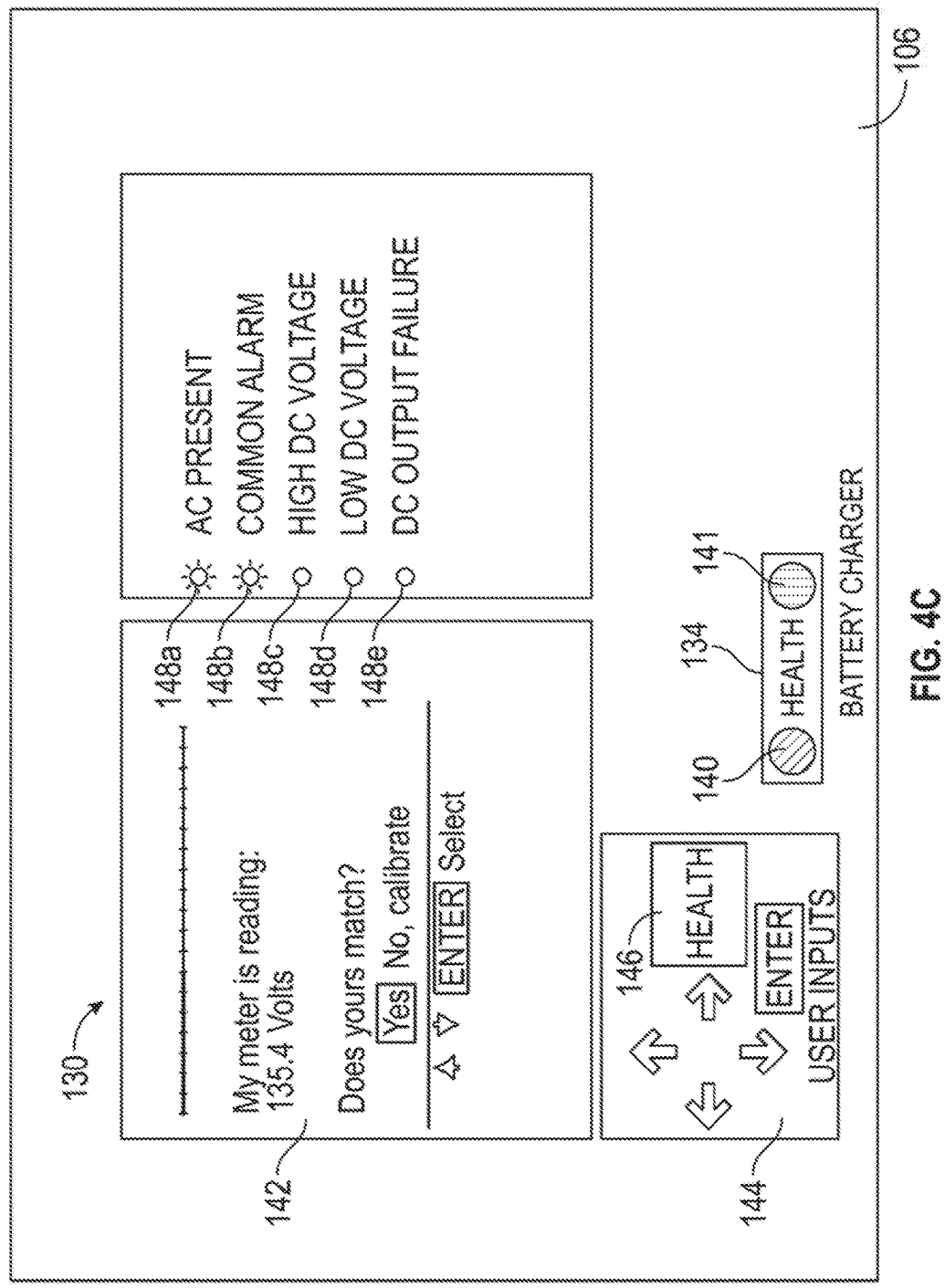

A meter calibration test is an example of a manual diagnostic test. FIGS. 4A through 4C show exemplary sequential screen messages that could be provided on the display 142 during the performance of the meter calibration test. In FIG. 4A, the display 142 indicates the beginning of the test. In FIG. 4B, the user is provided with directions concerning which electrical contacts to connect to a multimeter. In FIG. 4C, the user is provided with the voltage measured by an internal voltmeter and asked to verify whether the voltage displayed matches the voltage measured by the user using an external multimeter. If the measurements match, this test is passed. If not, additional steps may be performed to enable the battery charger 106 measurement to be properly calibrated. This test also fosters confidence on the part of the user/technician in the built-in measurements of the battery charger 106.

Figure 5A:
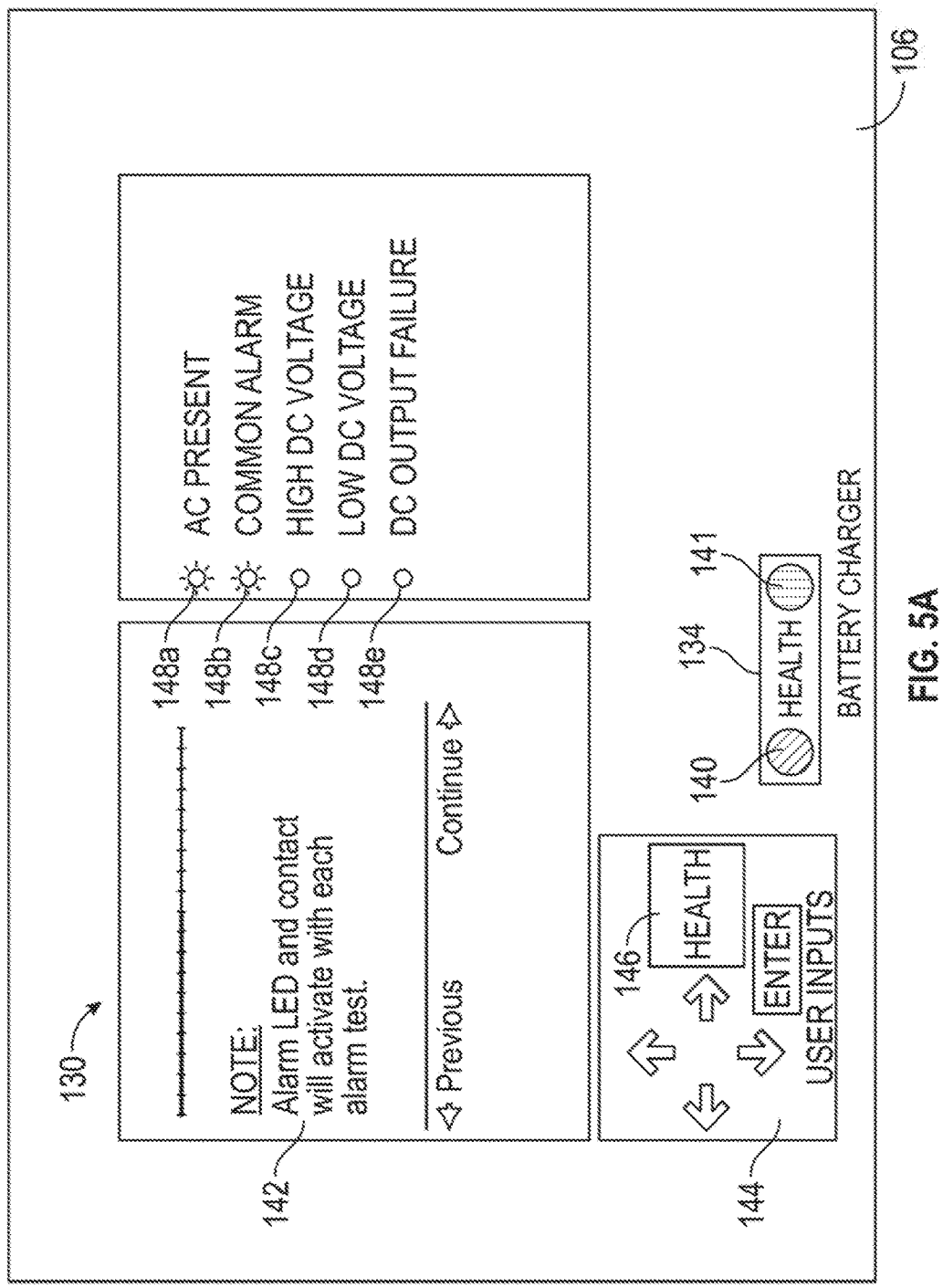
FIGS. 5A through 5G show exemplary screen messages associated with a high voltage DC output test.
Figure 5B:
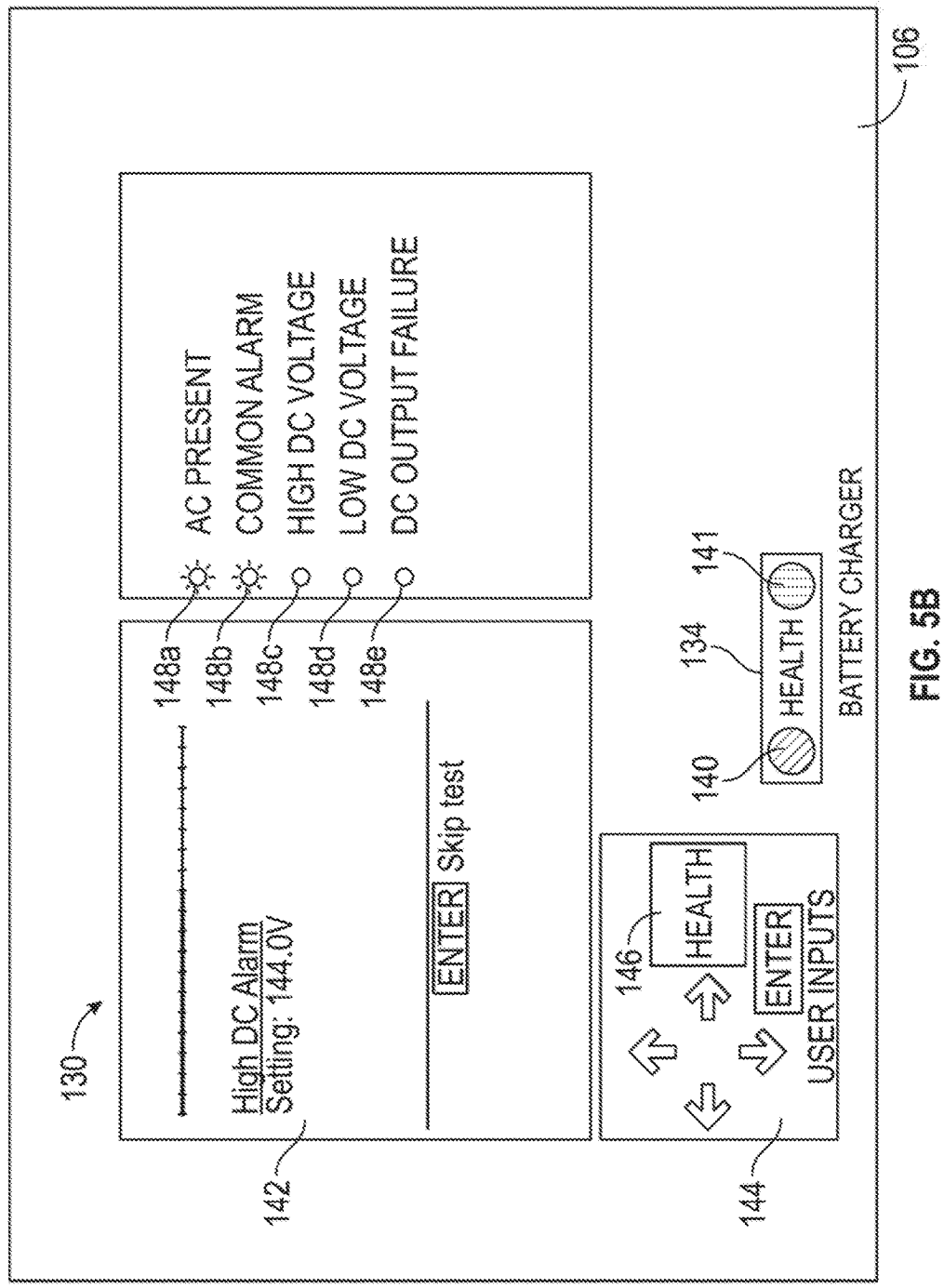
Figure 5C:
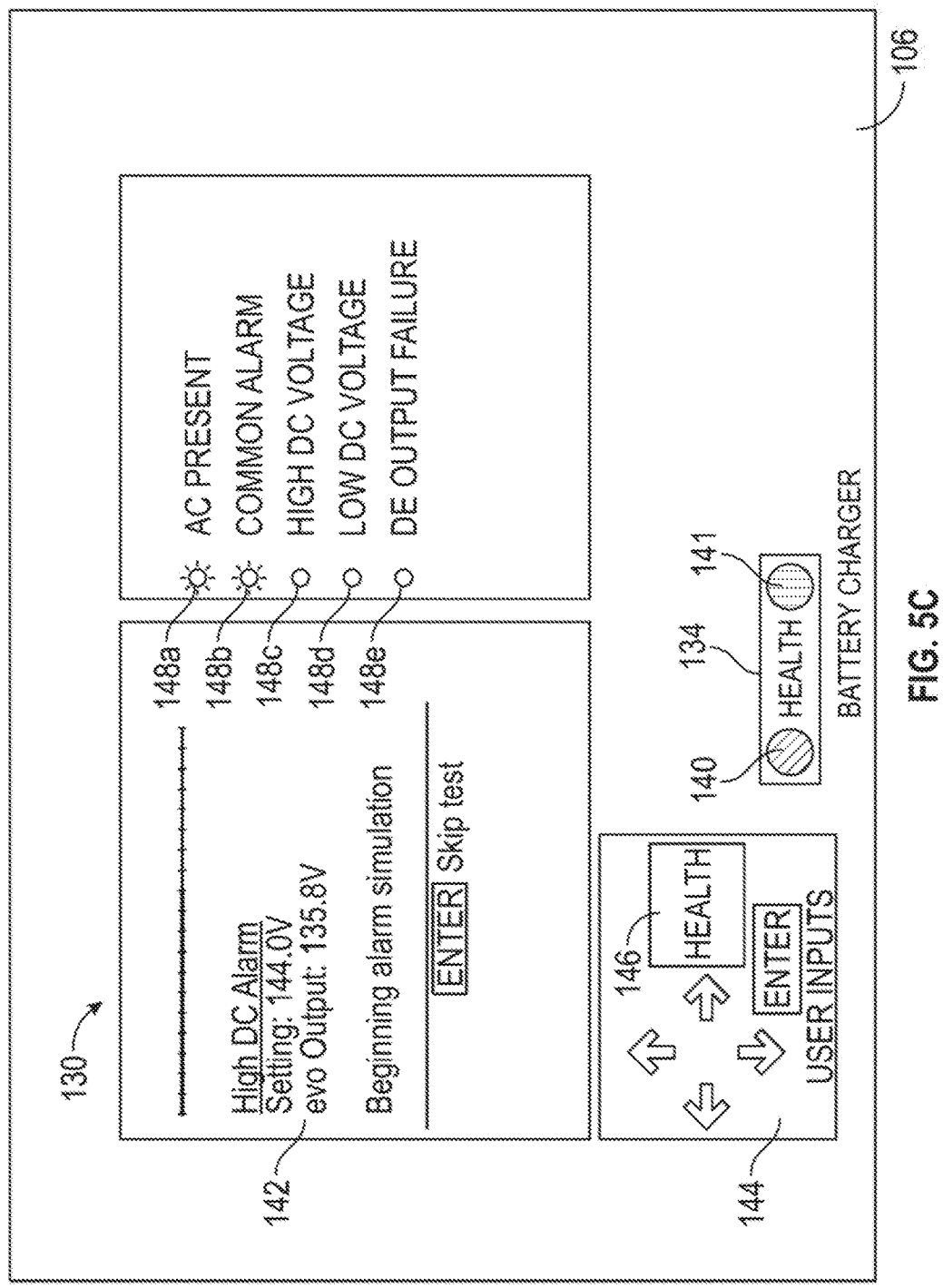
Figure 5D:
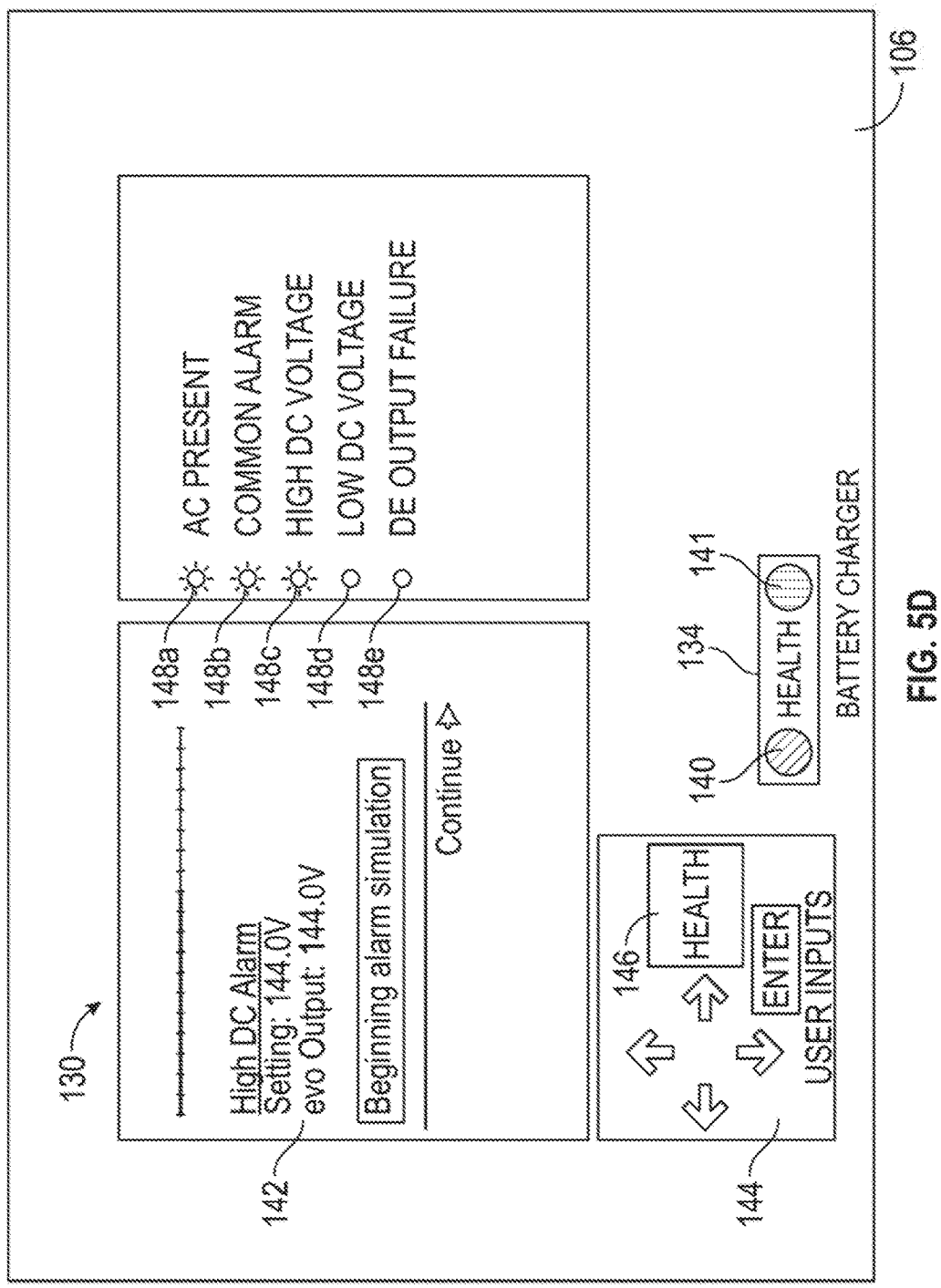
Figure 5E:
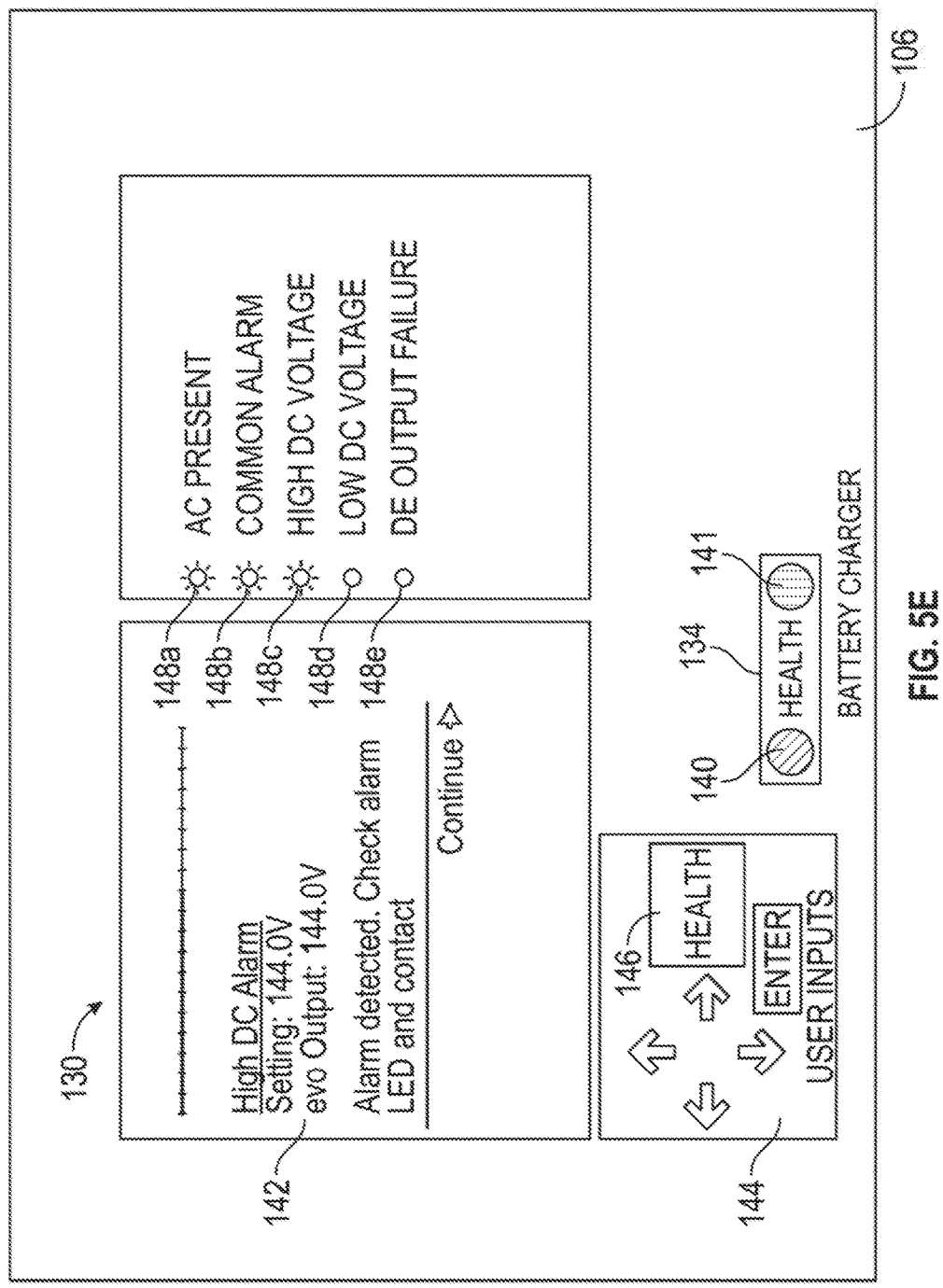
Figure 5F:
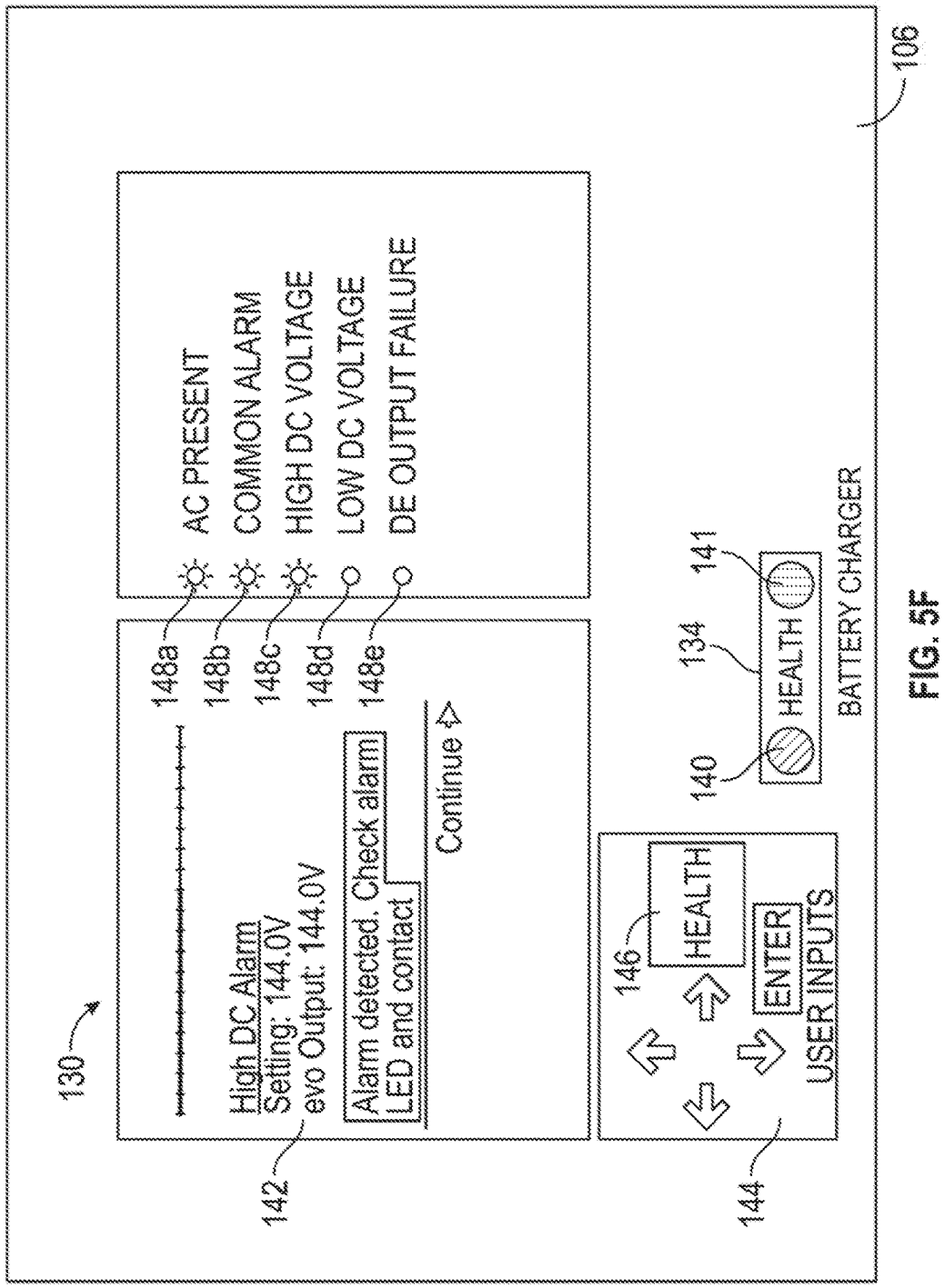
Figure 5G:
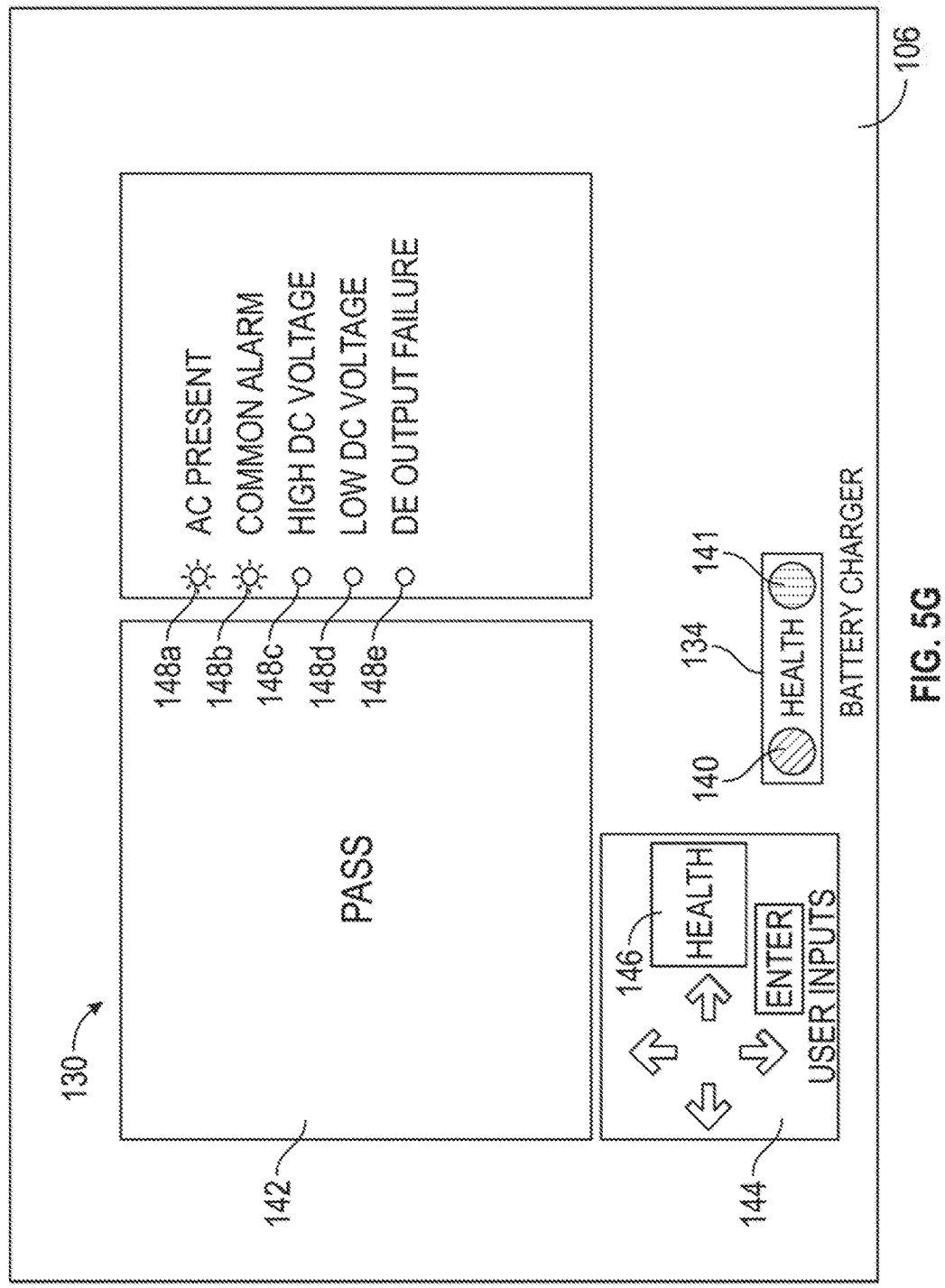

FIGS. 5A though 5G show a show exemplary sequential screen messages that could be provided on the display 142 during the performance of the high voltage DC test. In FIG. 5A, the user is informed that the test is beginning and that an alarm will activate during the test. In FIG. 5B, the high voltage DC alarm set point is displayed. In FIG. 5C, a simulated output voltage for the battery charger 106 that is lower than the set point is shown on the display 142. In FIG. 5D, the simulated output voltage of the battery charger 106 shown in the display 142 is increased to match (or exceed) the set point and the user is notified of the commencement of the alarm simulation. In FIG. 5E, the user is notified that an alarm has been detected. In FIG. 5F, the user is prompted to confirm that the alarm LED and contacts were activated. In FIG. 5G, the test is shown as being successful (which indicates that the user confirmed proper alarm function.

In the context of the tests described herein, "simulated" means that the display 142 shows a value for a system parameter involved in the test being performed for the purpose of making the test more realistic or engaging for the user. For example, with the high voltage DC test, a voltage for battery charger 106 that exceeds the set point is expected to trigger an alarm. Accordingly, in order to make the test more engaging for the user, the set point voltage and the "simulated voltage" of the battery charger 106 (which exceeds the set point voltage) are shown in the display 142 when an alarm is activated during the test. The simulated voltage is unlikely to, and is not intended to, reflect the actual output voltage of the battery charger 106. Table 1 identifies which tests described herein are simulated in this embodiment.

At the conclusion of the diagnostic tests initiated by pressing the health button 146, the controller illuminates the green light 140 if the battery charger 106 passes all of the diagnostic tests (i.e., test results are within established parameters for normal operation). Conversely, the controller will illuminate the red light 141 if the battery charger 106 fails any of the diagnostic tests (i.e., any of the test results are not within established parameters for normal operation).

Figure 6:
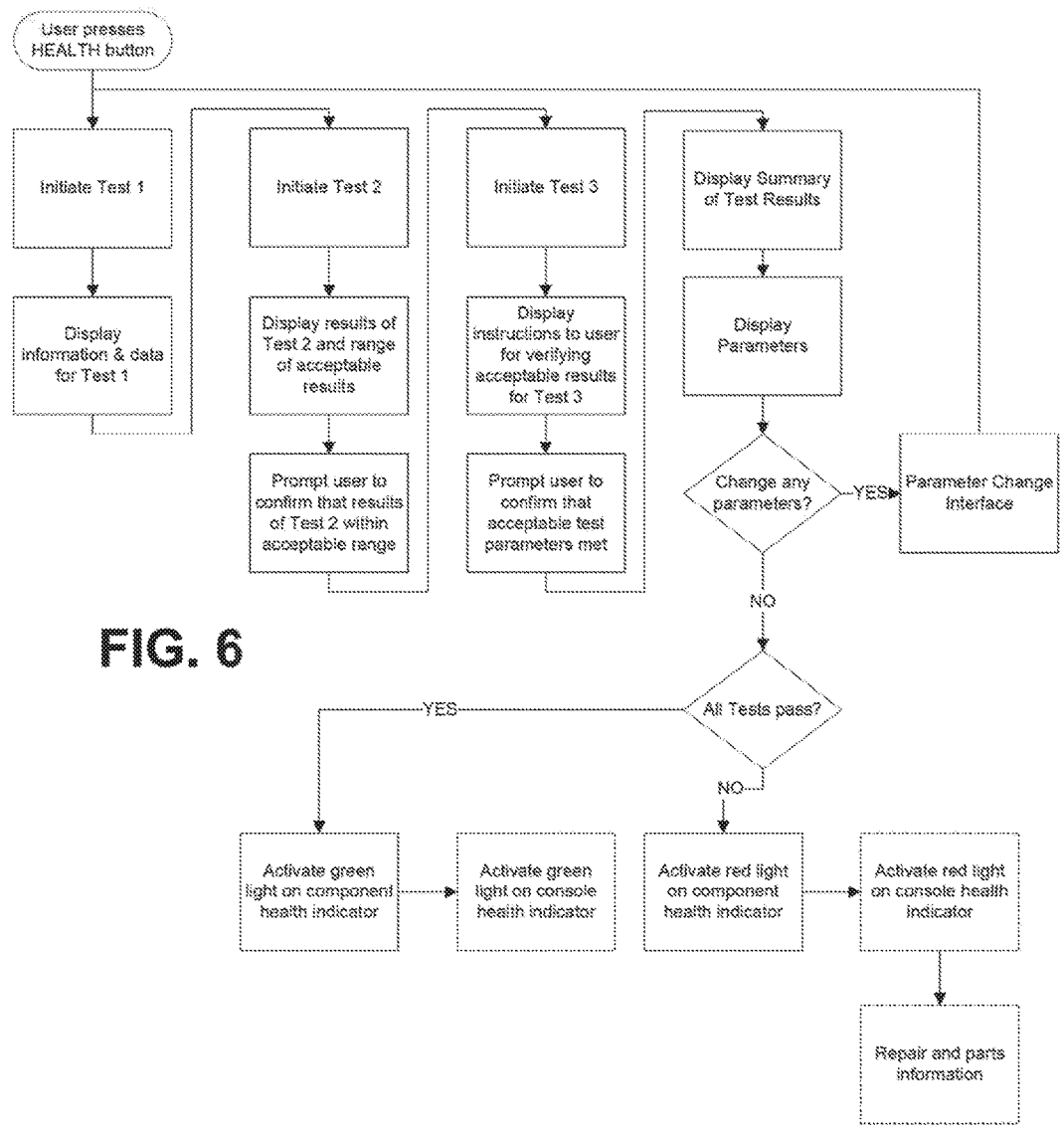
FIG. 6 shows a flow diagram of an exemplary set of diagnostic tests initiated by a technician by pressing a health button on the battery monitor control panel.

FIG. 6 is a flow chart showing generalized exemplary steps of the diagnostic test process. The steps shown in connection with Test 1 are exemplary of an autonomous diagnostic test. The steps shown in connection with Test 2 are exemplary of a semi-autonomous diagnostic test. The steps shown in connection with Test 3 are exemplary of a manual diagnostic test. It should be understood that a number of tests could be performed, as well as any combination of autonomous, semi-autonomous and manual diagnostic tests.

When a diagnostic test has failed, the controller optionally provides guidance to the user concerning the failure. Depending upon the nature of the failure, this could take the form of (1) instructions (text and/or video) for performing a repair, (2) identifying information for parts needing replacement, (3) information necessary to order a part needing replacement, and/or (4) a description of the reason for failure. In the case of a failed relay, it is common for spare relays to be available in a DC subsystem 100. Accordingly, in this embodiment, the guidance could include instructions for switching an affected circuit from a relay that has failed to a spare relay. The repair of this type of failure is referred to as a "self-healing" repair, meaning that the repair can be performed by reconfiguring the DC subsystem 100 and without installing replacement parts.

Figure 7A:
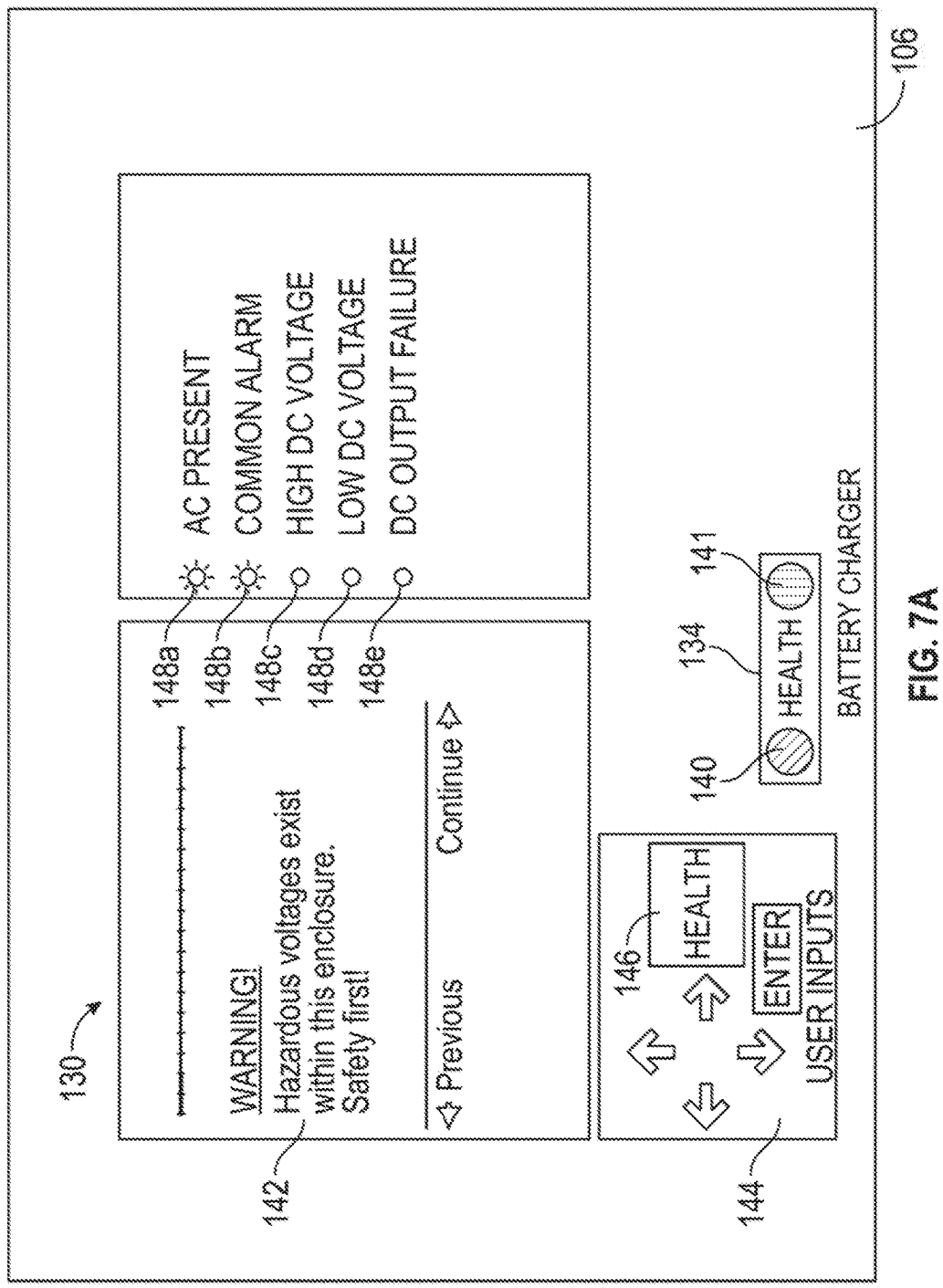
FIGS. 7A and 7B show exemplary screen messages associated with a warning.
Figure 7B:
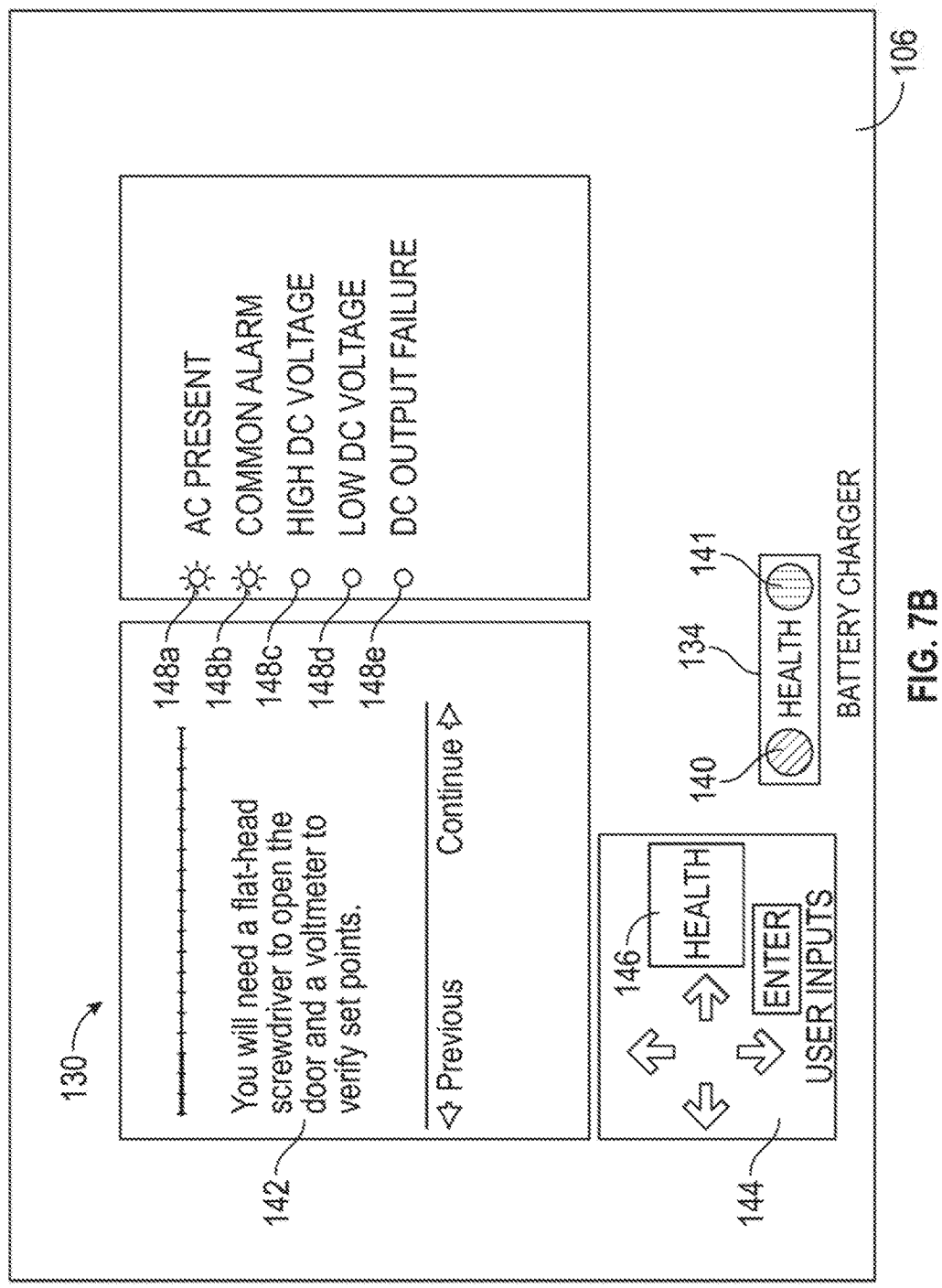

FIGS. 7A and 7B show exemplary sequential screens that communicate a warning to the user (in this case, a voltage that is outside of an applicable set point), identify any requirements or equipment needed, and provide instructions for verifying the set points.

It is also preferable that the controller of the battery charger 106 perform scheduled diagnostic tests, which are performed on a schedule or are triggered by system events other than user input. The results of these scheduled diagnostic tests will determine which of the status lights 140, 141 is illuminated based on the same criteria as the diagnostic tests initiated by pressing the health button 146.

The principles of operation of a health monitoring system in each of the other monitored modules in the DC subsystem 100 are the same as for the battery charger 106. Both the scheduled diagnostic tests and the diagnostic tests initiated by pressing the health button 146 will differ from module to module and will be tailored to the function of each module.

Preferably, the DC subsystem 100 includes one "aggregator" that tracks status information for all of the monitored modules of the DC subsystem. Optionally, each of the monitored modules (the battery charger 106, the battery monitor 104 and the console control module 126 in this embodiment) include a PLC (or other type of controller) and non-transitory storage that performs the diagnostic tests for that module. In this embodiment, each of the modules are programmed to select one module to act as the aggregator. The aggregator gathers status information for all of the monitored modules and is electrically connected to the aggregator status indicator 122. Alternatively, one controller could control and monitor all of the modules of the DC subsystem 100. Communication between the aggregator and other modules could be by any suitable connection known in the art, such as a serial communication link or binary contacts.

Referring again to FIG. 1, in this embodiment, the battery charger 106 serves as the aggregator. The battery charger 106 is chosen as the aggregator in this embodiment because it often has the most sophisticated control functionality and user interface, and is typically adapted to interface electronically with the other modules, and is electrically connected to the aggregator status indicator 122 via a console communication link. Accordingly, the controller located in the battery charger 106 is programmed to aggregate status information from the console control module 126 and the battery monitor 104. If all three modules are in "healthy" status (i.e., no pending diagnostic test failures), the controller will signal the console control module 126 to cause the green light in the aggregator status indicator 122 to be illuminated. Conversely, if any of the three modules is not in "healthy" status (i.e., one or more pending diagnostic test failures), the controller will signal the console control module 126 to illuminate the red light in the aggregator status indicator 122.

In this embodiment, the battery charger 106 controls functions that would be performed by the console control module 126 if the battery charger 106 were not present as the aggregator. For example, the air conditioner 138 and heater 139 could be controlled by the battery charger 106, using temperature information gathered by sensors that are connected to the console control module 126. Having the battery charger 106 make use of electrical connections provided by the console control module 126 and supplant control functions of the console control module 126 is desirable in some embodiments because the battery charger 106 will almost always have more robust control and data storage capabilities than the console control module 126.

In many systems, it is preferable for the battery charger 106 to be the aggregator if it is present. If a battery charger 106 is not present, it is preferable for the battery monitor 104 to be the aggregator. If neither a battery charger 106 nor a battery monitor 104 is present, then either no module serves as an aggregator or the console control module 126 could serve as an aggregator. In order to determine the presence and identity of other modules, the battery charger 106 is preferably programmed to either automatically detect the presence of the battery monitor 104 and/or console control module 126 via electrical connections to each module and/or provide a user prompt to confirm the presence of the battery monitor 104 and/or console control module 126 (See FIGS. 8-9). The battery monitor 104 is also preferably programmed to detect the presence of the battery charger 106 and a failure of the battery charger 106. If the battery monitor 104 detects the absence or failure of the battery charger 106, it is preferably programmed to take over the role of the aggregator and, in the case of a failure the battery charger 106, provide a notification thereof.

In this embodiment, the aggregator status indicator 122 is preferably located on the outside of the console 118, preferably on the outside of the door. This enables a technician to determine the overall health of the DC subsystem easily and without opening the console. In the absence of an aggregator module, the aggregator status indicator 122 would simply reflect the health status of the console control module 126.

Figure 8:
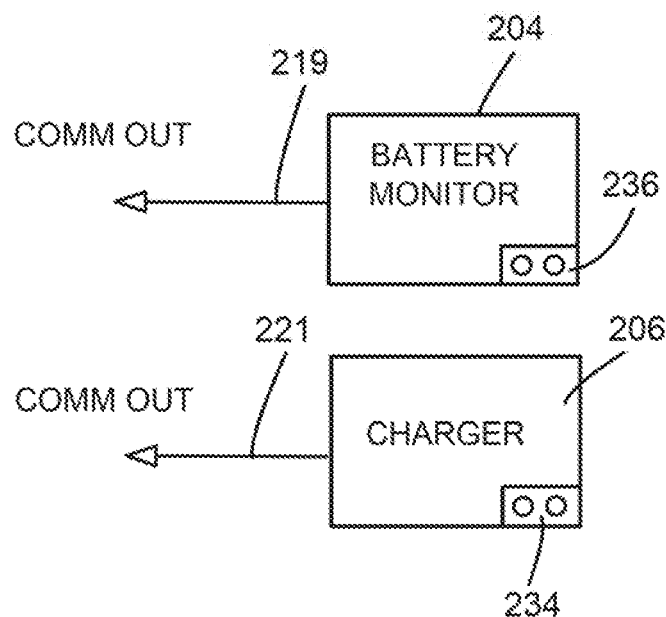
FIG. 8 shows a schematic diagram of an exemplary system including health monitoring-enabled battery charger and battery monitor.
Figure 9:
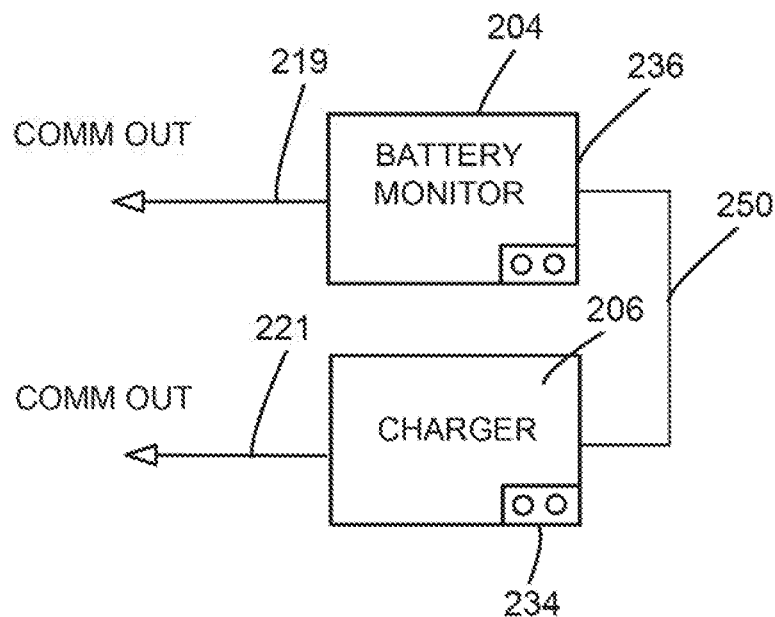
FIG. 9 shows a schematic diagram of an exemplary system including health monitoring-enabled battery charger and battery monitor having a communication link.

FIGS. 8 and 9 show examples of two exemplary health monitoring system configurations. In FIG. 8, a battery charger 206 and a battery monitor 204 are both present and both are health monitoring system-enabled. As is shown in FIG. 8, there is no communication link between the battery charger 206 and a battery monitor 204 and both have communication output links 219, 221. In this embodiment, the battery charger 206 and the battery monitor 204 each perform and display health-related functions independently (e.g., on health status indicators 236, 234, respectively). In FIG. 9, a communication link 250 has been added between the battery charger 206 and a battery monitor 204, which enables three different possible health-related modes: (a) the battery charger 206 acts as the master—performing and displaying health-related functions for both the battery charger 206 and a battery monitor 204, (b) the battery monitor 204 acts as the master—performing and displaying health-related functions for both the battery charger 206 and a battery monitor 204, and (c) both operate independently, as in FIG. 8.

Figure 10:
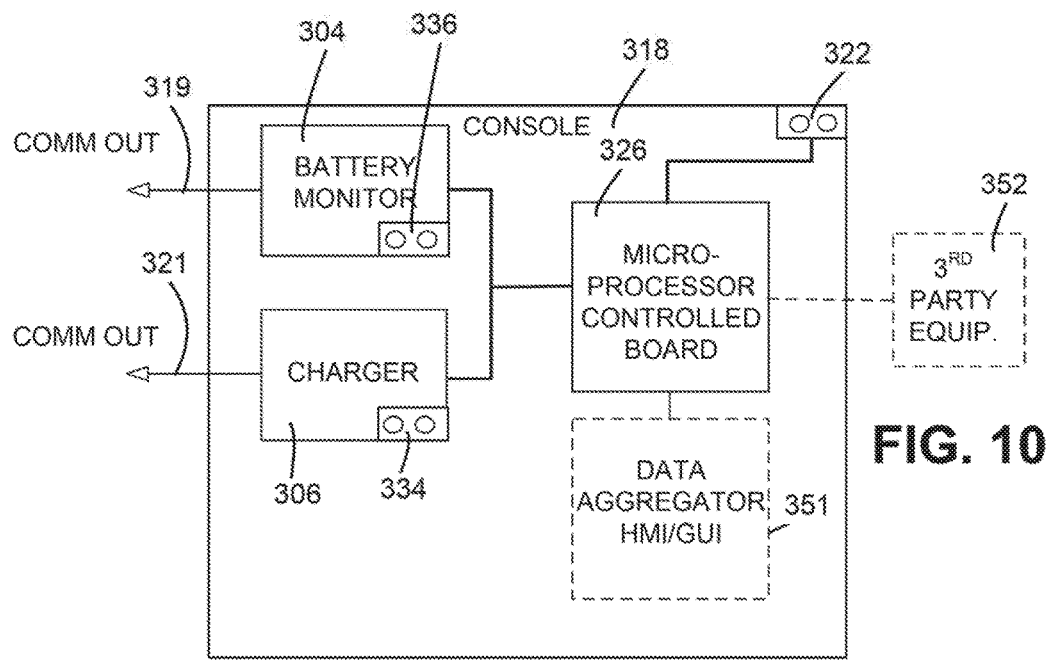
FIG. 10 shows a schematic diagram of an exemplary system including a health monitoring-enabled battery charger, battery monitor and console enclosure.
Figure 11:
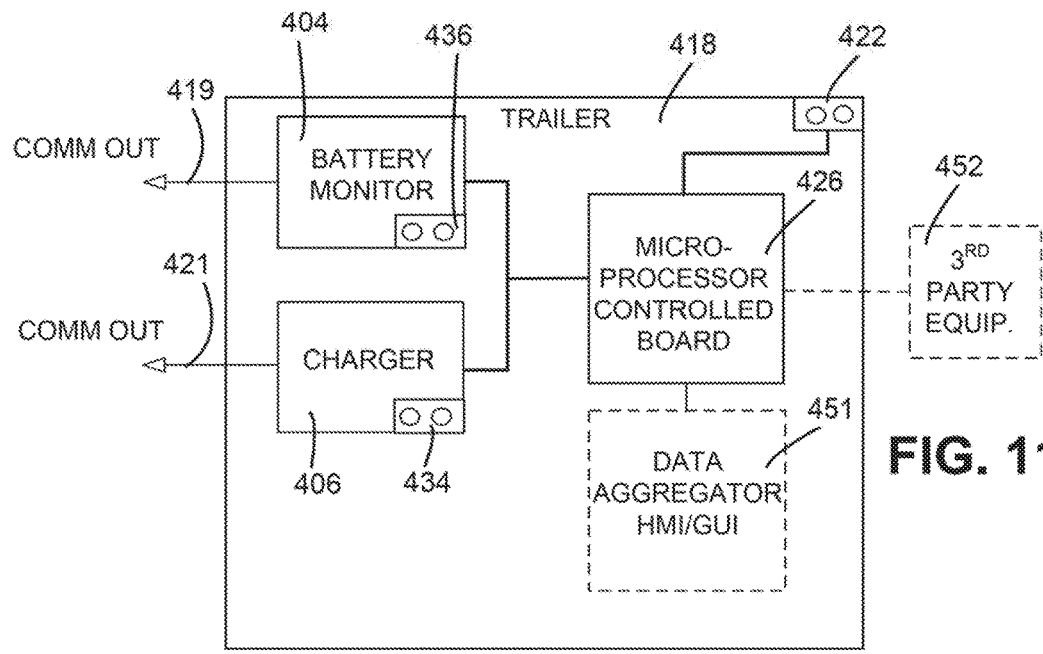
FIG. 11 shows a schematic diagram of an exemplary system including a health monitoring-enabled battery charger, battery monitor and trailer enclosure.

FIGS. 10 and 11 show examples of a console 318 or trailer 418, each containing a battery charger 306, 406 a battery monitor 304, 404, a micro-processor controlled board 326, 426, and an aggregator health indicator 322, 422. In the interest of simplicity, the operational structure of the health monitoring system of the FIG. 10 will be described. It should be understood that the operational structure of the health monitoring system of the FIG. 11 is identical, except that the enclosure is a trailer 418 instead of a console 318.

In the system shown in FIG. 10, the health status indicators 334, 336, 322 are all preferably functional, with the health status indicators 334, 336 of the modules present in the system (in this case, battery charger 306 and battery monitor 304) each displaying the health of the module on which the health status indicator is located (e.g., health status indicator 336 displays the health status of the battery monitor 304). Preferably, the health status indicator 322 of the console 318 is preferably an aggregator, meaning that it reflects the health status of all of the health monitoring system-enabled components in the system—in this embodiment, the console 318, battery charger 306, and battery monitor 304.

The console 318, battery charger 306, and battery monitor 304 are also preferably operationally configured to enable health testing for all of the health monitoring-enabled modules to be initiated and performed from a single graphical user interface (GUI). This GUI 351 could be located on the battery charger 306 or battery monitor 304, or a dedicated GUI could be provided as part of the console 318. In order to enhance electrical connections and communications between the modules and, optionally, any third party equipment 352, a micro-processor controlled board 326 is preferably provided.

Figure 12:
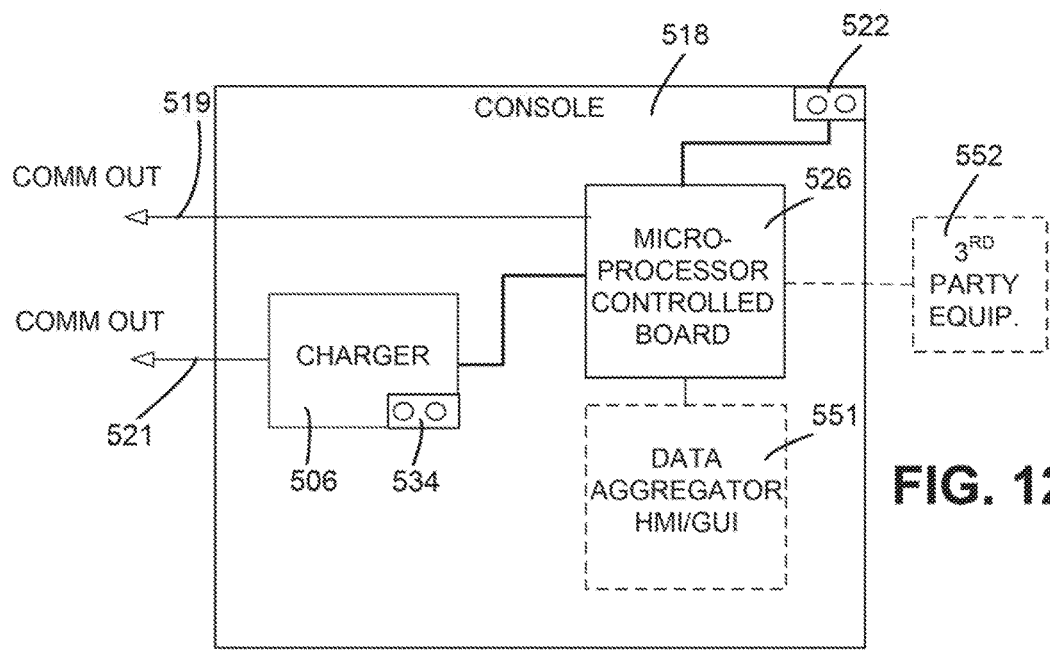
FIG. 12 shows a schematic diagram of an exemplary system including a health monitoring-enabled battery charger and console enclosure.
Figure 13:
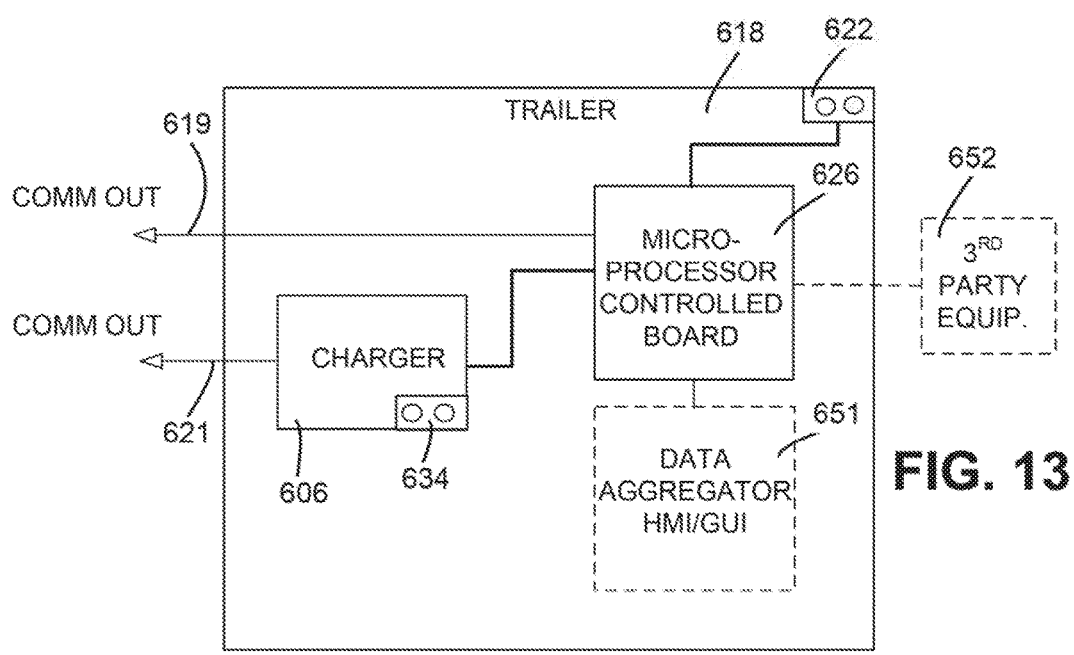
FIG. 13 shows a schematic diagram of an exemplary system including a health monitoring-enabled battery charger and trailer enclosure.

FIGS. 12 and 13 show examples of a console 518 or trailer 618, which are contain identical components to those of FIGS. 10 and 11, respectively, with the exception that a battery monitor is not included in either of the embodiments of FIGS. 12 and 13.

It will be further understood that various changes in the details, materials, and arrangements of the parts that have been described and illustrated in order to explain the nature of the described embodiments might be made by those skilled in the art without departing from the scope of the present invention.

The invention claimed is:

1. A monitoring system for monitoring and reporting an aggregate system status of a DC subsystem comprising an enclosure, a battery charger, a battery bank, and a load circuit that is operationally configured to selectively place the battery charger and the battery in electrical contact with a DC system load, the monitoring system comprising:
at least one monitoring-enabled module;
an aggregator comprising a controller, the aggregator being in electrical communication with each of the at least one monitoring-enabled module; and
an aggregate health status indicator in electrical contact with the aggregator;
wherein each of the at least one monitoring-enabled module is operationally configured to:
perform a plurality of tests and store test data relating to a result of each of the plurality of tests;
determine a status of the module based on the test data; and
communicate the determined status of the module to the aggregator; wherein the aggregator is operationally configured to:
determine, based on the determined status received from each of the at least one monitoring-enabled modules, the aggregate system status of the DC subsystem; and
display, on the aggregate health status indicator, an indication of the determined aggregate system status.

2. The system of claim 1, wherein the aggregate health status indicator is located on an exterior surface of the enclosure.

3. The system of claim 1, wherein each of the plurality of tests comprises measuring at least one operating characteristic of the module, prompting a user, through a graphical user interface, to confirm an operating characteristic of the module, or prompting the user, through the graphical user interface, to measure an operating characteristic of the module and compare the user measurement to a value for the operating characteristic provided by the module.

4. The system of claim 1, wherein the at least one monitoring-enabled module includes at least one selected from the group of the battery charger, a battery monitor, a climate control system, and a security system.

5. The system of claim 1, wherein the at least one monitoring-enabled module includes at least one selected from the group of the battery charger and a battery monitor.

6. The system of claim 1, wherein the aggregator is further operationally configured to:
report to at least one remote location, via a communication link coupled to the aggregator, the determined aggregate system status.

7. The system of claim 1, wherein the aggregator is further operationally configured to:
display, on a user interface within the enclosure, (i) the indication of the determined aggregate system status, and (ii) at least one message providing additional information concerning the determined aggregate system status.

8. The system of claim 7, wherein the aggregator is further operationally configured to:
report to at least one remote location, via a communication link coupled to the aggregator, the determined aggregate system status and the at least one message.

9. A method of monitoring and reporting the status of a DC subsystem comprising an enclosure, a battery charger, a battery bank, and a load circuit that is operationally configured to selectively place the battery charger and the battery in electrical contact with a DC system load, the method comprising:
performing a plurality of tests in each of at least one monitoring-enabled module and storing test data relating to a result of each of the plurality of tests;
determining a status of each of the at least one monitoring-enabled module based on the test data; and
communicating the status of each of the at least one monitoring-enabled module to an aggregator, the aggregator being in electrical contact with each of the at least one monitoring-enabled module;
determining, based on the status data received by the aggregator from each of the at least one monitoring-enabled modules, an aggregate system status of the DC subsystem;
displaying on an aggregate health status indicator, an indication of the determined aggregate system status.

* * * * *